(12) United States Patent
Betzel et al.

(10) Patent No.: US 9,284,659 B2
(45) Date of Patent: Mar. 15, 2016

(54) DEVICE AND METHOD FOR MONITORING CRYSTALLIZATION

(75) Inventors: Christian Betzel, Schenefeld (DE); Rolf Hilgenfeld, Luebeck (DE); Dierk Hilterhaus, Kirchgellersen (DE); Thomas Klupsch, Jena (DE); Peter Muehlig, Jena (DE); Karsten Dierks, Hamburg (DE); Arne Meyer, Hamburg (DE)

(73) Assignee: Xtal Concepts GmbH, Hamburg (DE)

( * ) Notice: Subject to any disclaimer, the term of this patent is extended or adjusted under 35 U.S.C. 154(b) by 535 days.

(21) Appl. No.: 13/806,149

(22) PCT Filed: Jun. 30, 2011

(86) PCT No.: PCT/DE2011/001393
§ 371 (c)(1),
(2), (4) Date: Feb. 12, 2013

(87) PCT Pub. No.: WO2012/000493
PCT Pub. Date: Jan. 5, 2012

(65) Prior Publication Data
US 2013/0139749 A1    Jun. 6, 2013

(30) Foreign Application Priority Data
Jul. 1, 2010   (DE) .......................... 10 2010 025 842

(51) Int. Cl.
*C30B 29/54* (2006.01)
*C30B 7/02* (2006.01)
*C30B 7/08* (2006.01)
*C30B 7/00* (2006.01)
*C30B 29/58* (2006.01)

(52) U.S. Cl.
CPC ... *C30B 7/02* (2013.01); *C30B 7/00* (2013.01); *C30B 7/08* (2013.01); *C30B 29/54* (2013.01); *C30B 29/58* (2013.01); *Y10T 117/1008* (2015.01)

(58) Field of Classification Search
CPC ........ C30B 29/54; C30B 29/55; C30B 29/56; C30B 7/02; C30B 7/08
See application file for complete search history.

(56) References Cited

U.S. PATENT DOCUMENTS

| | | | | |
|---|---|---|---|---|
| 4,727,024 A | * | 2/1988 | Koocher et al. | ................. 435/7.4 |
| 4,919,899 A | | 4/1990 | Herrmann et al. | |
| 5,619,043 A | * | 4/1997 | Preikschat et al. | ............ 250/574 |
| 7,470,324 B2 | | 12/2008 | Hoffmann | |

(Continued)

*Primary Examiner* — Robert M Kunemund
(74) *Attorney, Agent, or Firm* — Patent Central LLC; Stephan A. Pendorf

(57) ABSTRACT

A method for crystallizing a substance dissolved in a solvent, including the following steps: introducing a solvent volume containing the substance into a chamber having a preset temperature, humidity, and gas composition, adding a predetermined volume of a precipitant to the solvent volume containing the substance, allowing the solvent to evaporate while simultaneously observing structural changes in the solvent volume containing the substance and the precipitant by means of dynamic light scattering, detecting weight changes and determining the molarities, making an association with the location in the phase diagram on the basis of the DLS measurement and the results of the molarity determination, allowing a predetermined number of crystal nuclei to form by adding solvent or adding precipitant, putting the solvent volume containing the substance and the precipitant into a metastable state by adding solvent and/or protein solution or by allowing the concentration of the dissolved substance to decrease by allowing nucleation cores to form, maintaining the metastable state by adding a predetermined amount of the substance to the solvent volume containing the substance and the precipitant or allowing the solvent to evaporate until at least one crystal of a predetermined size is formed.

7 Claims, 12 Drawing Sheets

(56) References Cited

U.S. PATENT DOCUMENTS

| | | |
|---|---|---|
| 2001/0006807 A1 | 7/2001 | Bray et al. |
| 2003/0233978 A1 | 12/2003 | Niimura et al. |
| 2007/0017291 A1* | 1/2007 | Cypes et al. .................... 73/590 |
| 2009/0168066 A1* | 7/2009 | Hansen et al. ................ 356/440 |

* cited by examiner

DEVICE AND METHOD FOR MONITORING CRYSTALLIZATION

BACKGROUND OF THE INVENTION

Field of the Invention

The invention relates to an apparatus and a method for controlling the crystal growth of macromolecules, especially of biological macromolecules.

Description of the Related Art

A key task in the field of biochemistry and molecular biology is the atom-precise elucidation of three-dimensional structure of biomolecules, especially proteins. Most currently available structural models of proteins and other biomolecules in the resolution range of 0.25 nm and better were obtained using X-ray crystallography. A precondition for the application of this procedure is the presence of single crystals. The degree of internal order of the crystal determines significantly the quality of the data obtained and thus the precision of the elucidated structure.

Due to the large number of parameters that influence the crystallization of proteins (concentration of the material to be crystallized, the concentration of solvent, concentration of the precipitant, concentration further auxiliaries, changes in pH, changes in temperature, etc. . . . ) it is, to this day, hard to obtain reproducible results in crystallization.

From U.S. Pat. No. 4,919,899 an apparatus for the production of protein crystals is known. The method employed is known as the "hanging drop" method, wherein the concentration of the components of the droplets is controlled via evaporation or addition of the solvent. An automated optimization of the crystallization conditions is envisioned.

The dynamic control of crystal growth for proteins is also known from US2001006807 A1. Here, the concentration of the solvent is controlled via the temperature and the gas stream.

All known methods for reproducible and automated crystallization have in common that, by influencing a parameter, a predetermined or fixed path in the phase diagram is followed.

Especially water-insoluble proteins, such as membrane proteins which are of particular interest for drug activity investigation, are not available by reproducible and automated crystal growth.

BRIEF SUMMARY OF THE INVENTION

It is an object of the invention to improve the crystallization of biomolecules, in particular proteins. Furthermore, it is an object of the invention to provide an apparatus and methods, which makes possible an automatable and reproducible growth of crystals from biological material. Furthermore, it is an object of the invention to provide an apparatus and method that allows reproducible and automatable growth of crystals of biological material, for which this has not been possible. Furthermore, it is an object of the invention to provide an apparatus and methods, which makes possible the reproducible and automated growth of crystals of biological material, without having to rely on trial and error.

Surprisingly, it has been found that it is possible to observe and influence the crystallization of biological macromolecules at a submicroscopic level, thus creating the opportunity to reach almost any point in the phase diagram, and to remain there, when the devices and methods described in the claims are used. The dependent claims describe advantageous embodiments of the invention.

The inventive method comprises the steps of
a. applying a drop of a sample solution of the material to be crystallized on a sample holder in a process chamber
b. setting and maintaining the temperature, humidity and gas composition in the process chamber
c. keeping constant the weight of the drop before the addition of precipitant(s) by the addition of solvent
d. measuring the size of the radius of the protein molecules in the sample drops after the application of the sample drop and during the following process steps by means of the DLS
e. addition of precipitant solution into the sample drop and decrease of the sample mass by controlled solvent vapor diffusion
f. entry in [commencement of?] the nucleation zone once a certain concentration ratio of protein and precipitant is present in the sample volume
g. decision based on the results of the continuous DLS measurement
   either reducing the number of nuclei by the addition of solvent
   or increasing the addition of further precipitant to increase the number of nuclei
h. leaving the nucleation zone in two ways:
   A: by addition of solvent and/or protein solution
   B: by reduction in the concentration of free protein molecules as a result of nucleation
   A and B are accompanied by a decrease of scattered light intensity
i. reaching a desired point within the metastable zone in the phase diagram, recognizable by a crystal growth [increase], by metered addition of the solvent in order to keep the concentration ratios of protein and precipitant constant.
j. keeping the system in the metastable zone in the event of a slowing of the crystal growth by either
   addition of protein to increase the protein concentration
   or
   reducing the solvent addition, whereupon due to the continuously occurring evaporation an increase in protein- and precipitant-concentration occurs.
k. adding an antifreeze solution instead of the solvent, introducing a mixture of solvent and antifreeze solution into the sample at a rate that compensates for the solvent loss as a result of vapor diffusion (constant weight), wherein by and by an enrichment of the antifreeze solution results.
l. extraction of the crystals The apparatus of the invention includes the following components:

Automated sample pipetting device for manipulation of drops

Automated sample changer

Optical device (microscopic resolution), e.g., microscope with camera for observing the processes taking place in the sample and to determine the crystal sizes as well as to position the non-contacting measuring and metering processes.

Dynamic light scattering (DLS) to determine the molecular size distribution with submicroscopic resolution Static light scattering to measure the absolute intensity of scattered light Thermal radiation sensor for the determination of reaction enthalpies Microscale for the precise determination of all molarities or their changes Microdosing device with multiple channels for:
Water
Precipitant
Buffer solution
Protein solution
Additives
Antifreeze solution
Cross-linking
Ligands
Detergents
Other substances as required
Humidity control
Temperature control
Regulation of atmospheric composition
Device for introducing seed crystals

BRIEF DESCRIPTION OF THE SEVERAL VIEWS OF THE DRAWINGS

The present invention is illustrated by way of example and not by limitation in the accompanying drawings in which like reference numbers indicate similar parts and in which.

DETAILED DESCRIPTION OF THE INVENTION

Figure 1:
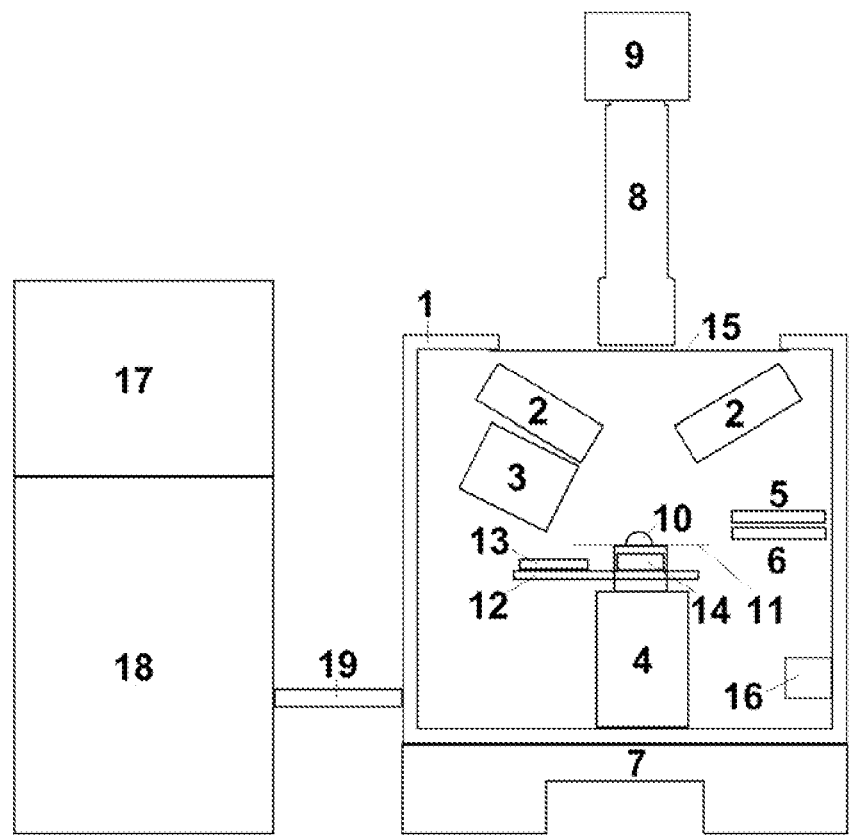
FIG. 1 is a schematic of the inventive apparatus.

The components of the apparatus (X-tal controller) in detail are:

A microscope, or other optical device, preferably equipped with a CCD camera or other imaging system for observing the processes taking place in the sample and for measurement of the crystals FIG. 1 (8, 9). The determination of the crystal growth rate is carried out via the optical device of a microscope objective lens and a CCD camera. At a given time the outline of the growing crystal can be measured and plotted against time. From the slope of the curve the crystal growth rate can be determined. Other possibilities of crystal measurement include for example volume measurement and manual measurement methods.

A lighting device with an LED or any other type of light source.

A scale, preferably with a weighing accuracy of 0.1 μgrams, or any other suitable device for determining the mass. It is used to determine the concentrations or concentration ratios of all substances involved in the reaction. This is particularly important in addition dosing of substances, which are required for crystallization, as well as for the monitoring of the evaporation of the water content of the sample solution FIG. 1 (4) In this way, the determination of the evaporation rate of the sample can be carried out more accurately than is possible for example by optical methods.

Multiple dosing systems, preferably microdosing systems with a conveyance volume from 30 to 300 pL per stroke. FIG. 1 (2) or any other device which permits a defined substance entry into the sample.

A device for measuring the size distribution and/or shape of the particles contained in the solution. This can preferably be done by taking advantage of light a scattering method (FIG. 1 (3)). Particularly preferred is the use of a method of dynamic light scattering (DLS), wherein the scattering volume lies directly in the sample volume. The use of a DLS method, in which the components are arranged in a back-scattering geometry, allows a very compact measurement setup. A particular advantage of DLS is the noninvasive determination of particle size distribution which is also possible in very small volumes of less than 10 μL preferably less than 1 μL.

A process chamber, in this case equipped with a device for regulating the relative humidity to 1%, more preferably 0.1%, particularly preferably 0.01%, the temperature to 0.1° C. and the gas composition. Temperature control can be by any conventional heating and cooling producers, preferred is use of Peltier elements. FIG. 1 (1)

A device for measuring the heat change in the sample is achieved in this particular case by a non-contact, pyroelectric thermal sensor, which detects the changes in temperature taking place due to the reaction in the sample FIG. 1 (14).

A base, in this case a vibration-damped base FIG. 1 (7).

Alternatively, but not necessarily, the apparatus can be operated remotely via the Internet or Ethernet, or alternatively, but not necessarily, the data is stored in a database.

Detergents that play an important role especially for the crystallization of membrane proteins include ionic or nonionic detergents. Preferably detergents have a saturated alkyl group. Such detergents include alkyl-beta-D-glucosides, alkyl-beta-D-thioglucosides, alkyl-beta-D-maltosides especially with heptyl-, octyl-, nonyl-alkyl groups. In detail dimethylamine, oligo-oxyethylene, n-tridecyl-β-D-maltopyranoside, n-dodecyl-β-D-thiomaltopyranoside, ANAPOE®-C12E9, octaethylene monodedecyl glycol ether, ANAPOE®-C12E8, ANAPOE®-C13E8, n-dodecyl-α-D-maltopyranoside, n-dodecyl-β-D-maltopyranoside, CYMAL®-7, ANAPOE®-X-114, ANAPOE®-C12E10, n-undecyl-β-thiomaltopyranoside, ANAPOE®X-100, sucrose monododecanoate, CYMAL®-6, n-undecyl-α-D-maltopyranoside, n-undecyl-β-D-maltopyranoside, CYCLOFOS™-7, pentaethylene monodecylether, n-decyl- β-D-maltopyranoside, ANAPOE®-C10E6, n-decyl-β-D-maltopyranoside, ANAPOE®-C10E9, n-decyl-β-D-maltopyranoside, CYMAL®-5, n-nonyl-β-D-thiomaltopyranoside, dimethyldecylphosphine oxide, n-nonyl-β-D-maltopyranoside, n-nonyl-β-D-glucopyranoside, CYMAL®-4, tetraethylene glycol monomethyl ether, n-octyl-β-D-thiomaltopyranoside, hexaethyleneglycol monooctylether, ANAMEG®-7 can be used as detergents.

As precipitants there may be organic compounds, as well as organic and inorganic salts. As organic compounds there may be, for example, polyethylene glycol, isopropanol or dimethyl sulfoxide, as inorganic salts there may be, inter alia, sodium chloride, ammonium sulfate or lithium chloride. Possible organic salts may be amongst others sodium acetate, sodium citrate or sodium tartrate.

As ligands there may be all kinds of natural products up to proteins, as well as all types of synthetic compounds.

Additives can be used which positively affect the crystallization of the protein. These may be, for example, antioxidants (ascorbic acid, lecithin, stannous chloride), amphiphilic (1,2,3 heptane triol, benzamindine) or divalent metal ions (magnesium chloride, calcium chloride or acetate).

For cross-linking (cross-linking reagents) substances can be used which join two polymers together. Here, the compounds can have covalent or ionic character. Examples are: 1-ethyl-3-(3-dimethylaminopropyl) carbodiimide (EDC), succinimidyl-4-[N-maleimidomethyl] cyclohexane-1-carboxylate (SMCC), (dithiobis [succinimidylpropionate]) (DSP).

As a cryoprotectant are preferably used glycerol, PEG 200-600, glucose, inositol, ethylene glycol and isopropanol.

As buffers, there may be employed all of the compounds of this type that include tris (hydroxymethyl)-aminomethane (TRIS), phosphate buffer ($NaH_2PO_4 + Na_2HPO_4$), 4-(2-hydroxyethyl)-1-piperazineethanesulfonic (HEPES) and 2-(N-morpholino)ethanesulfonic acid (MES).

The inventive method is based on the extraction of information from the drops and the use of this information for targeted intervention in the composition of the crystallization batch by addition or removal of substances. By measuring the changes in weight using a fine scale it is possible to quantify the individual components in the drop.

The precipitant concentration can be increased, as well as decreased. This is done by adding the precipitant solution via the microdosage system or by evaporation in the case of increase in concentration. Reducing precipitant concentration can be effected by addition of water or a mixture of all other components.

The system also permits addition of other substances in the sample to induce chemical reactions.

Another application is the addition of substances that cause a reduction in freezing point of the mother liquor. This is an important application in the field of protein crystallization. The antifreeze solution prevents the formation of water ice. This treatment may be necessary, since the diffraction experiments are usually performed at 100° K in order to minimize radiation damage.

Figure 2:
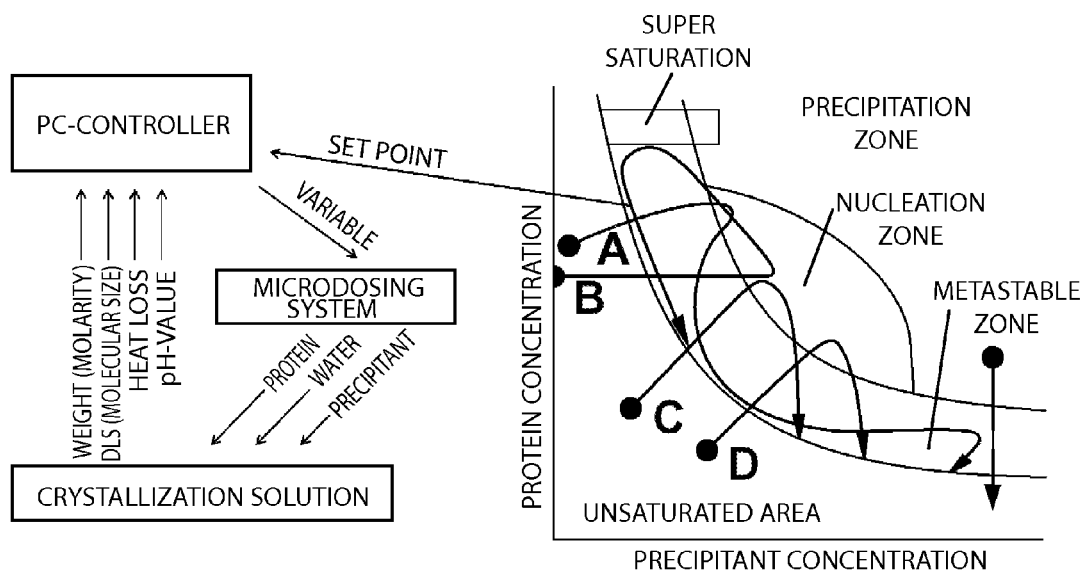
FIG. 2 shows the protein concentration plotted against the concentration of precipitant.

The phase diagram shows the existence of areas of the phases or states of matter of a substance or mixture of substances depending upon thermodynamic parameters. FIG. 2 shows the protein concentration plotted against the concentration of precipitant. The formation of a solid phase of the merger of freely moving molecules in solution is a classic example of a phase transition, which is a physical discontinuity. In the case of crystallization, this discontinuity represents the assembly of a subset of similar molecules in an orderly fashion (nucleus) within a solution. Such a nucleus causes more molecules to attach in an identical manner (emerging crystal), and so to enlarge the nucleus. Crystallization occurs in supersaturated solutions, and is terminated when the concentration of dissolved molecules reaches the saturation state.

The crystal growth represents a central goal of the intervention in the crystallization system. (As long as the crystals grow and that no new crystals are formed one has done everything right.) Crystal growth at constant crystal number is only possible within the metastable zone in the phase diagram. In the nucleation zone crystal growth likewise occurs, however, with persistent nucleation the number of the crystals increases continuously. In the undersaturated area the number of crystals remains constant but it also no crystal growth takes place. Sometimes, even a shrinking of crystals is observed.

Figure 3:
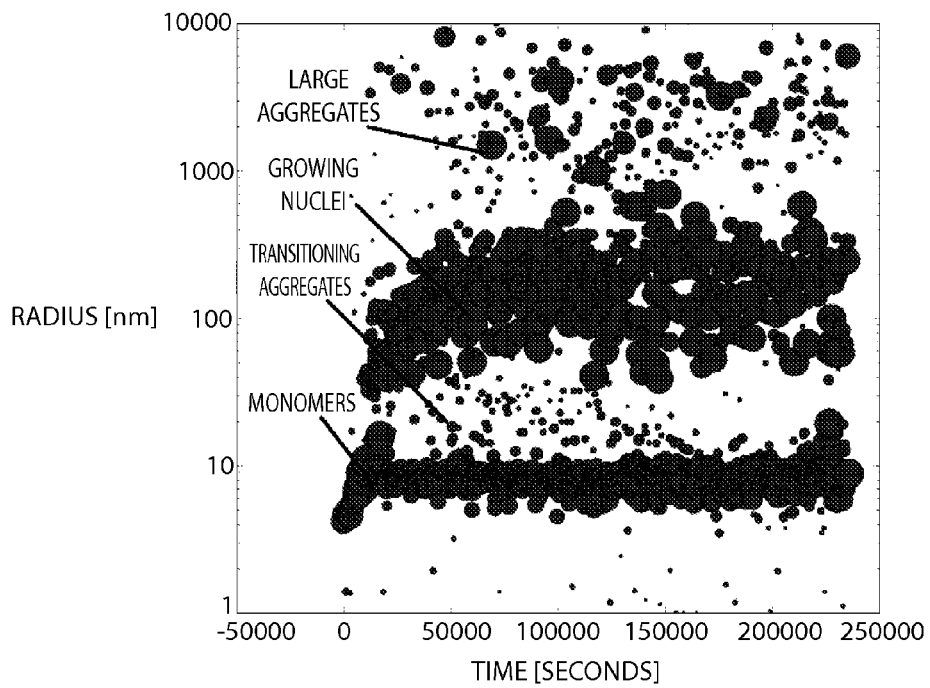
FIG. 3 represents the DLS measurement showing that an enormous number of nuclei were present in a broad size distribution in the mother liquor, before crystals begin to grow in such a solution.

The results of the DLS measurement showed that an enormous number of nuclei were present in a broad size distribution in the mother liquor, before crystals begin to grow in such a solution (FIG. 3). DLS also shows the dependence of the increase in the size of these aggregates on the concentration ratio of the precipitant and the protein. Thus it is possible to specifically and directly navigate in the phase diagram and to exercise influence already before the formation of large aggregates. The formation of large aggregates is therewith no longer based on trial and error, but it can be controlled.

The carrying out of a crystallization experiment to produce crystals of biological macromolecules always begins with the sample application. The sample is a drop of an aqueous protein solution in a volume of between 1 and 100 µl. The sample is pipetted onto a sample holder, or applied with an appropriate dosing device. The sample holder is located in the weighing position of the ultra-fine scale and allows the laser beam for the dynamic light scattering (DLS) to be sent in the sample. Simultaneously, the sample is observed by microscope camera optics.

The position of the sample allows the addition of solvent by a metering microdosing in minute droplets (~30 pl), to compensate for a steady loss of solvent from the droplets by evaporation. All components are housed in temperature- and humidity- and gas composition-controlled process chamber. A sample radius distribution obtained by DLS measurement of the protein molecules in solution at the beginning of the experiment is shown in FIG. 4.

Figure 5:
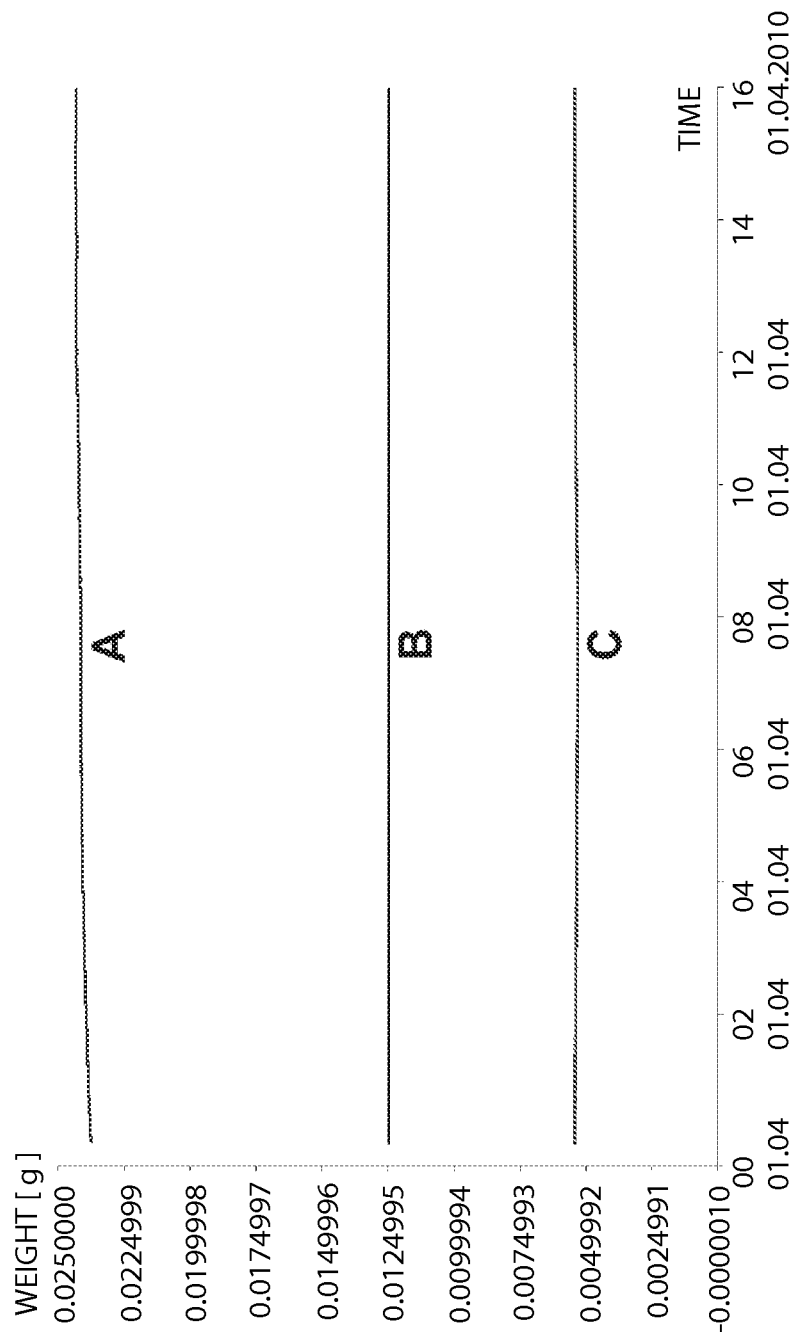
FIG. 5 shows that during DLS output measurement the weight of the sample is kept constant and in addition relative humidity (A) and air temperature (C) are held to certain values.

The DLS measurement output serves for assurance that the sample contains no interfering particles such as protein aggregates or solid contaminants that may affect both the measurement and the crystallization. During this DLS output measurement the weight of the sample is kept constant by the microdosing (FIG. 5, B). In addition, the parameters of relative humidity (A) and air temperature (C) are held to certain values in the process chamber.

Figure 4:
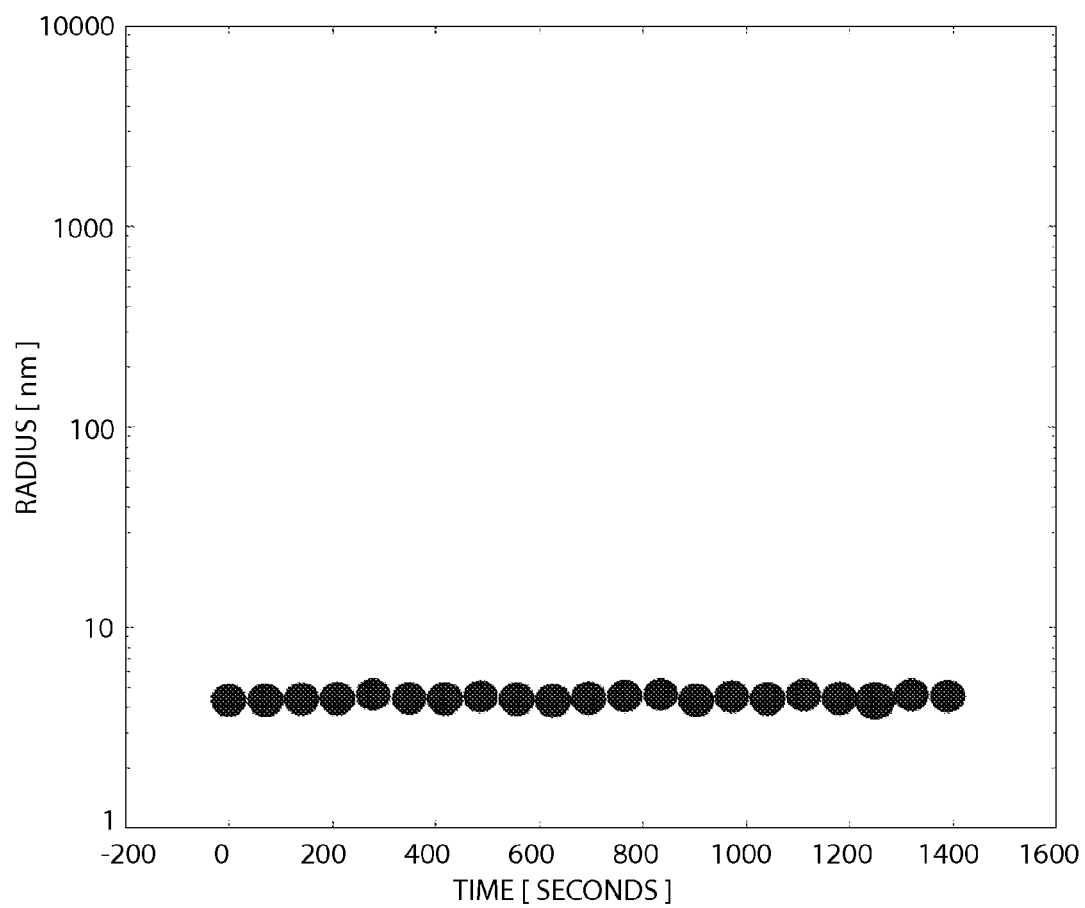
FIG. 4 shows a sample radius distribution obtained by DLS measurement of the protein molecules in solution at the beginning of the experiment.
Figure 6:
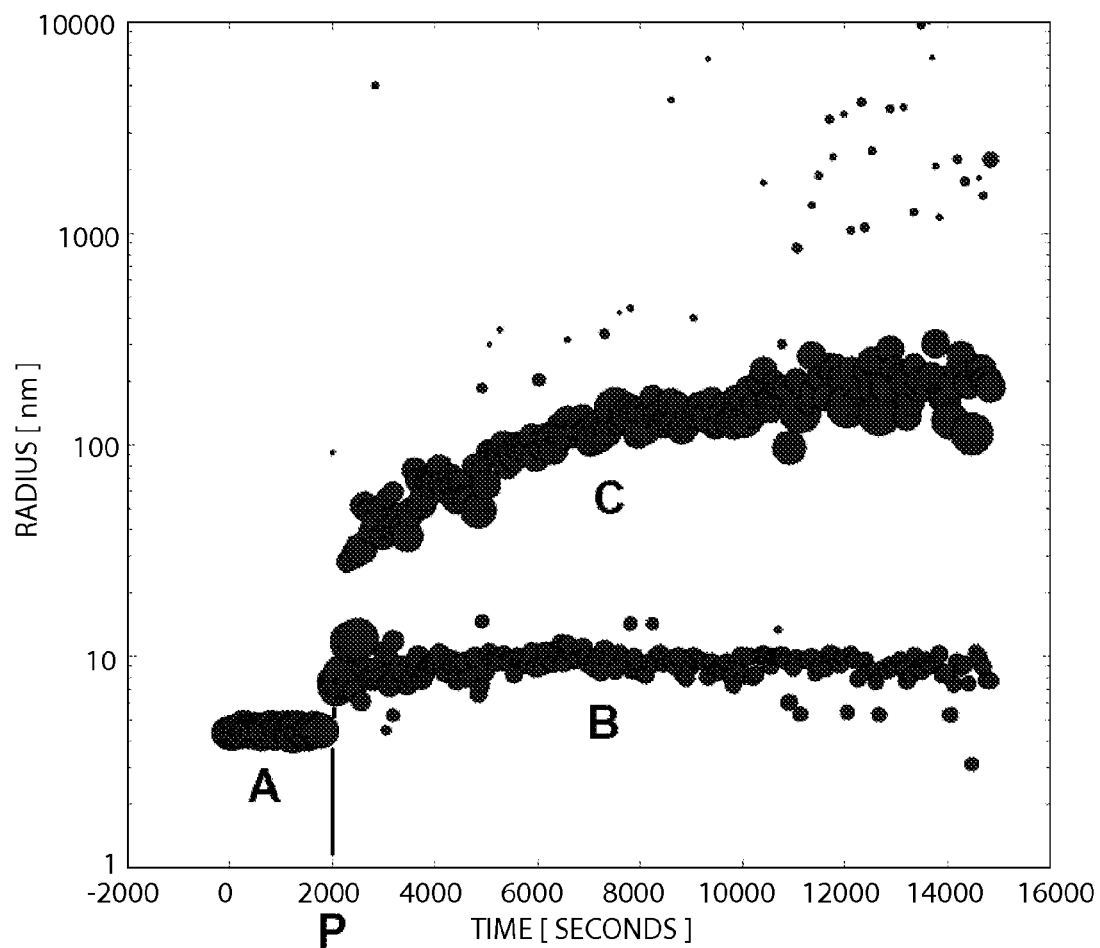
FIG. 6 shows a measurement with the DLS-protein before addition of precipitant (A) the precipitant addition at time (P) after 2000 seconds, the modified peak for the protein, (B) and nuclei (C)

If, during the DLS measurement, the sample starting measurement is as in FIG. 4—and thus suitable for crystallization, one can begin with the actual crystallization experiment. Typically, the crystallization of biological macromolecules is performed by the addition of a substance (precipitant) which competes with the dissolved protein molecules for the water of hydration and thereby favors interactions between the protein molecules with each other. Interactions of protein molecules together usually lead to a combining of the protein molecules which are then present as nuclei whose radius is measured by DLS. Depending on the amount of added precipitant this reaction takes place in different forms. FIG. 6 shows a measurement with the DLS-protein before addition of precipitant (A) the precipitant addition at time (P) after 2000 seconds, the modified peak for the protein, (B) and nuclei (C).

Figure 7:
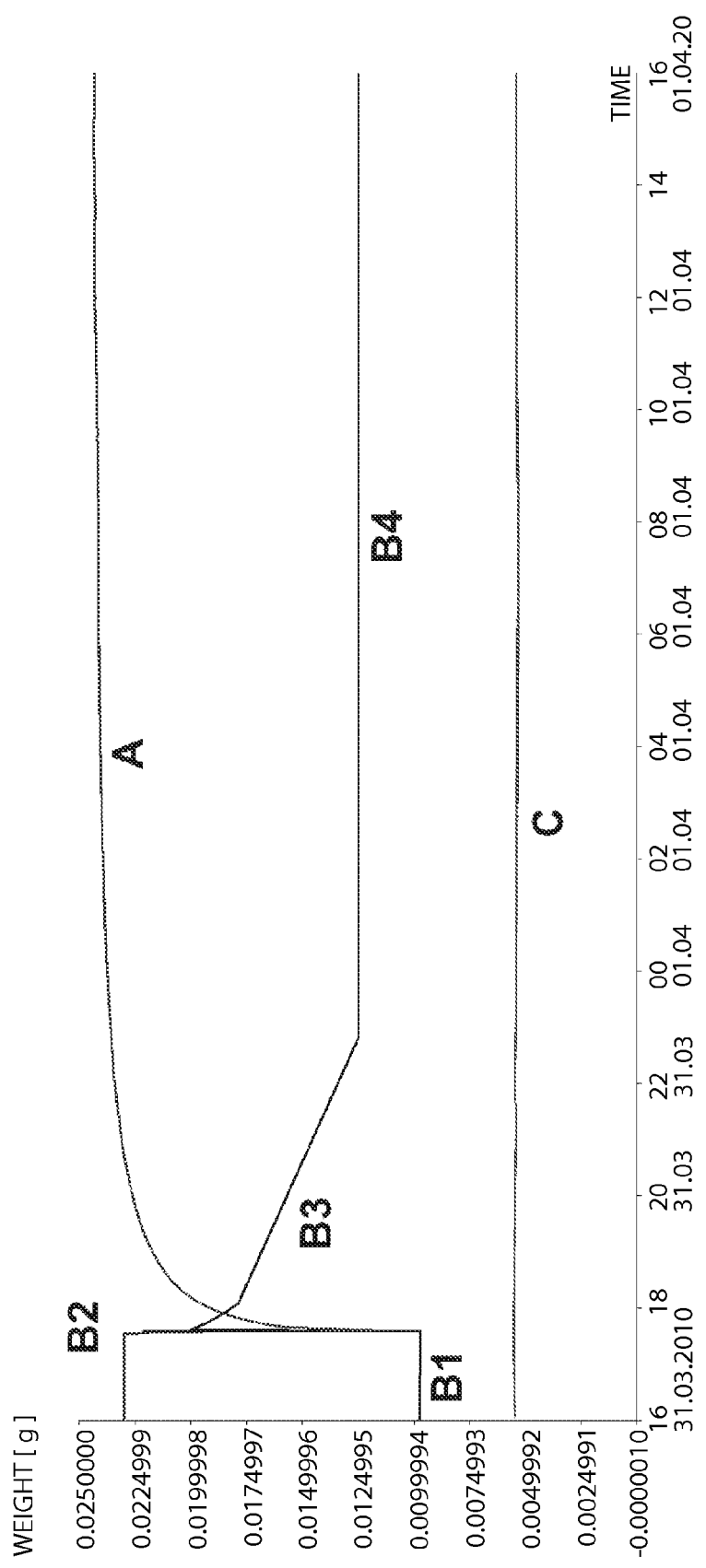
FIGS. 7 shows the corresponding weight curve (B) to FIG. 6.

The amount of added precipitant can be read with reference to the weight curve. FIG. 7 shows the corresponding weight curve (B) to FIG. 6. B1 corresponds to the period 0-2000 s from FIG. 6. Because of the early detection of nucleation, there exists the possibility to influence the nucleation reaction at a very early stage, i.e., to weaken or strengthen it by adding solvent or precipitant.

FIG. 7, B2 represents the weight gain by addition of precipitant. FIG. 7, B3 represents the phase of the nucleation.

Figure 8:
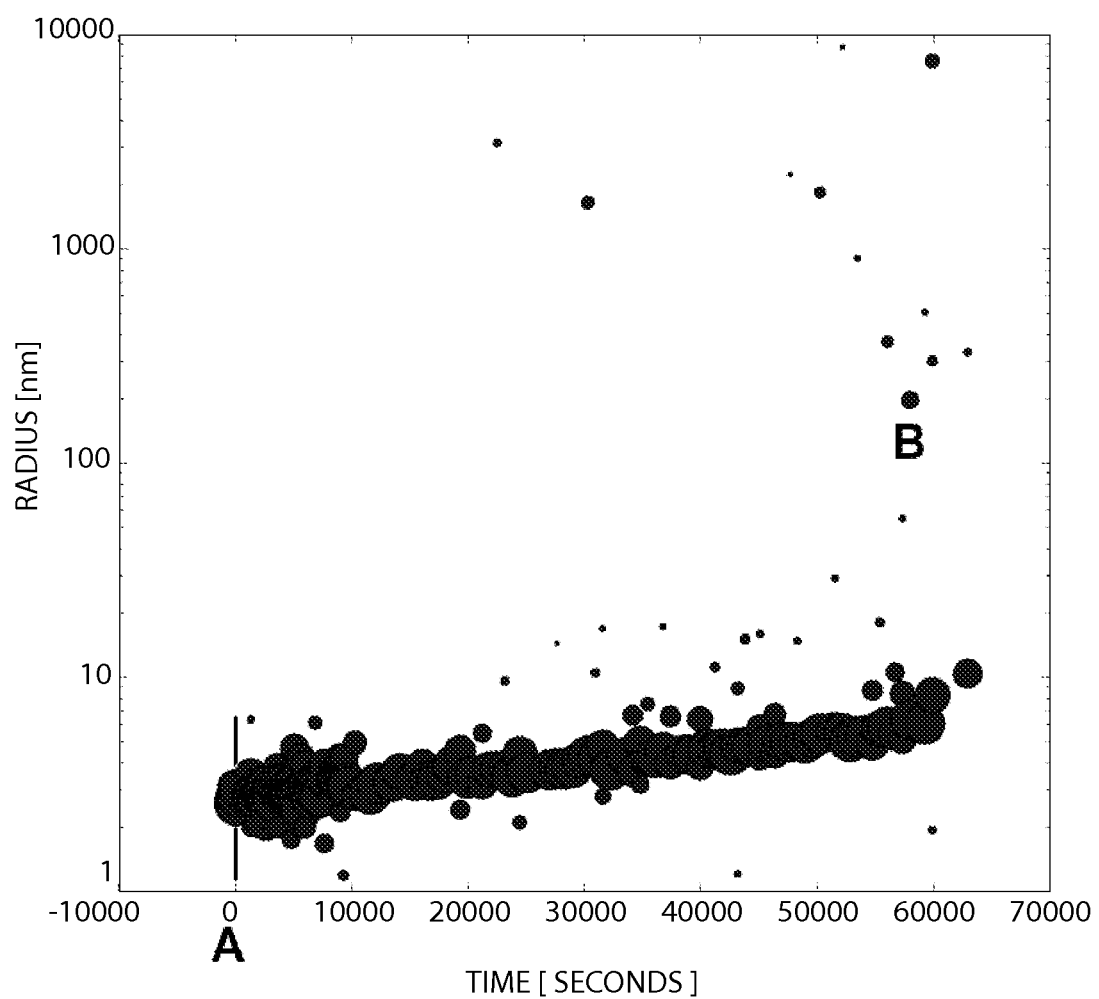
FIGS. 8 shows the intensity of the nucleation depends in part on the concentration ratios of the components and on the protein used, using as an example another protein.
Figure 9:
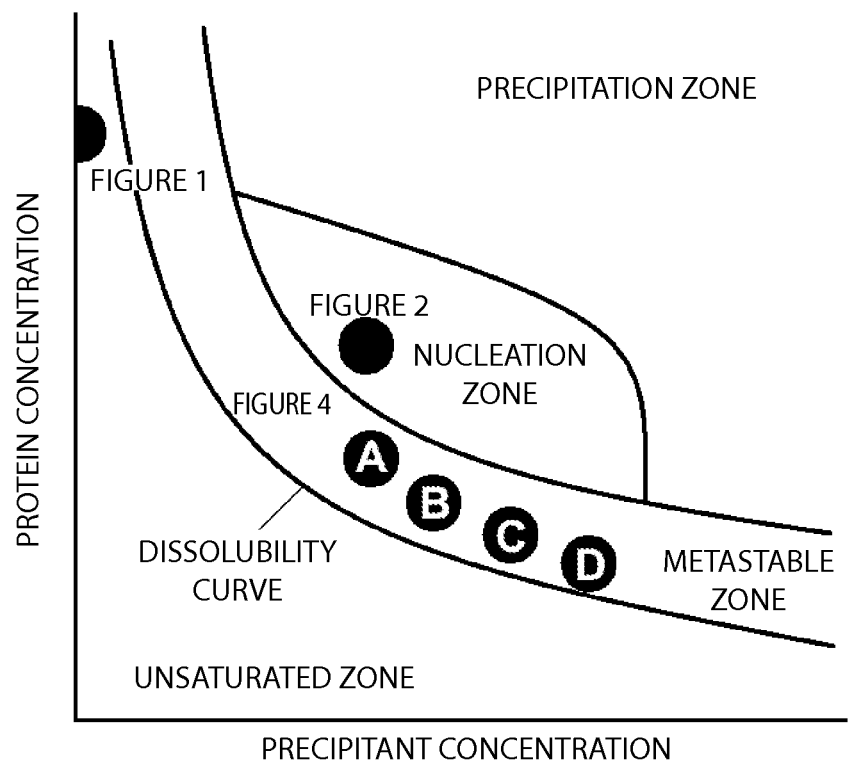
FIG. 9 shows precipitation zone on a protein concentration vs. precipitant concentration graph.

The use of the ultra-fine scale allows the calculation of the concentration ratios in the sample during the period of B3 in FIG. 7. As a result of evaporation of the solvent content, the concentration ratios are constantly changing. FIG. 7, A represents the relative humidity, C represents the air temperature in the processing chamber The intensity of the nucleation depends in part on the concentration ratios of the components and on the protein used. FIG. 8 shows this using as an example another protein: A: addition of the precipitant at time 0 seconds; B: nucleation occurring after 60,000 seconds.

The continuous crystallization is observed by the microscope optics. As soon as the crystals are fully grown, they can be removed from the apparatus.

The DLS measurements as well as measured concentration ratios of the components in the sample, which can be calculated by the weight curves, allow an assignment to the positions in the phase diagram. In FIGS. 4 and 5 there is a certain protein concentration, while the concentration of precipitant is 0. By addition of the precipitant, the protein concentration is reduced and concentration of precipitant is increased to a certain value in the sample. During the nucleation phase and subsequent crystal growth, the protein concentration in the droplet decreases, since the crystals adsorb protein molecules from the solution, thereby reducing the protein concentration. The concentration of precipitant slowly increases because of the solvent vapor diffusion. The progressive crystal growth indicates the position of the metastable zone in the phase diagram. The crystal growth is complete when in the phase diagram the solubility curve is reached.

A schematic representation of the inventive process can be found in FIG. 2 A, B: The method allows a predefined path in the phase diagram to run automatically. This is done both by the addition of solvent and by the addition of protein and precipitant solution. Beyond this, the system can vary the path, if the DLS data or data from other sensor systems are close to this. This is particularly useful in cases in which the phase diagram is not exactly known. The situation in which the protein and precipitant concentration is so high that it results in the precipitation of the protein can be avoided by the method (B).

C, D: solvent vapor diffusion in a conventional crystallization experiment. This increases both the protein and the concentration of precipitant in the same proportion as employed in the formation of nuclei in the nucleation zone. By the growth of the forming crystals the protein is removed from the solution, so that the protein concentration decreases.

By measuring the change in weight of the establishment of a closed control loop is possible. Via feedback, it is possible to maintain certain concentration conditions for long periods or to target certain concentration ratios.

With this method, it is possible to maneuver back and forth in the phase diagram or to stay at certain positions which are suitable, for example, for optimal growth of a crystal.

Dynamic light scattering allows the measurement of the size distribution of the particles in the sample. In crystallization, a distinction is made between two steps: 1 formation of nuclei (nucleation) and 2 crystal growth. Both steps take place in properly selected conditions in a region of the phase diagram, which is called the supersaturated solution. Nuclei are small particles, their size distribution and quantity is determined in a specific case by light scattering measurement.

The nucleation zone generally has a higher degree of supersaturation than the growth region which is also referred to as a metastable zone. For nucleation, the concentrations of the precipitant need to be higher than in the metastable zone. Under these conditions, however, there is also a rapid growth of the nuclei, and there is a risk of creating a large number of however very small crystals.

For X-ray analysis, however, there is interest in large single crystals (about 0.5 mm in size). That means for the experiment that one quite rapidly approaches the nucleation zone, but does not spend too much time in this concentration range, so that few as possible nuclei arise. By adding a solvent to the sample the nucleation zone is left again, but only until the metastable zone is reached. Under these conditions the concentration ratios of protein and precipitant are then kept constant long enough until the crystals have reached their maximum size.

Figure 10:
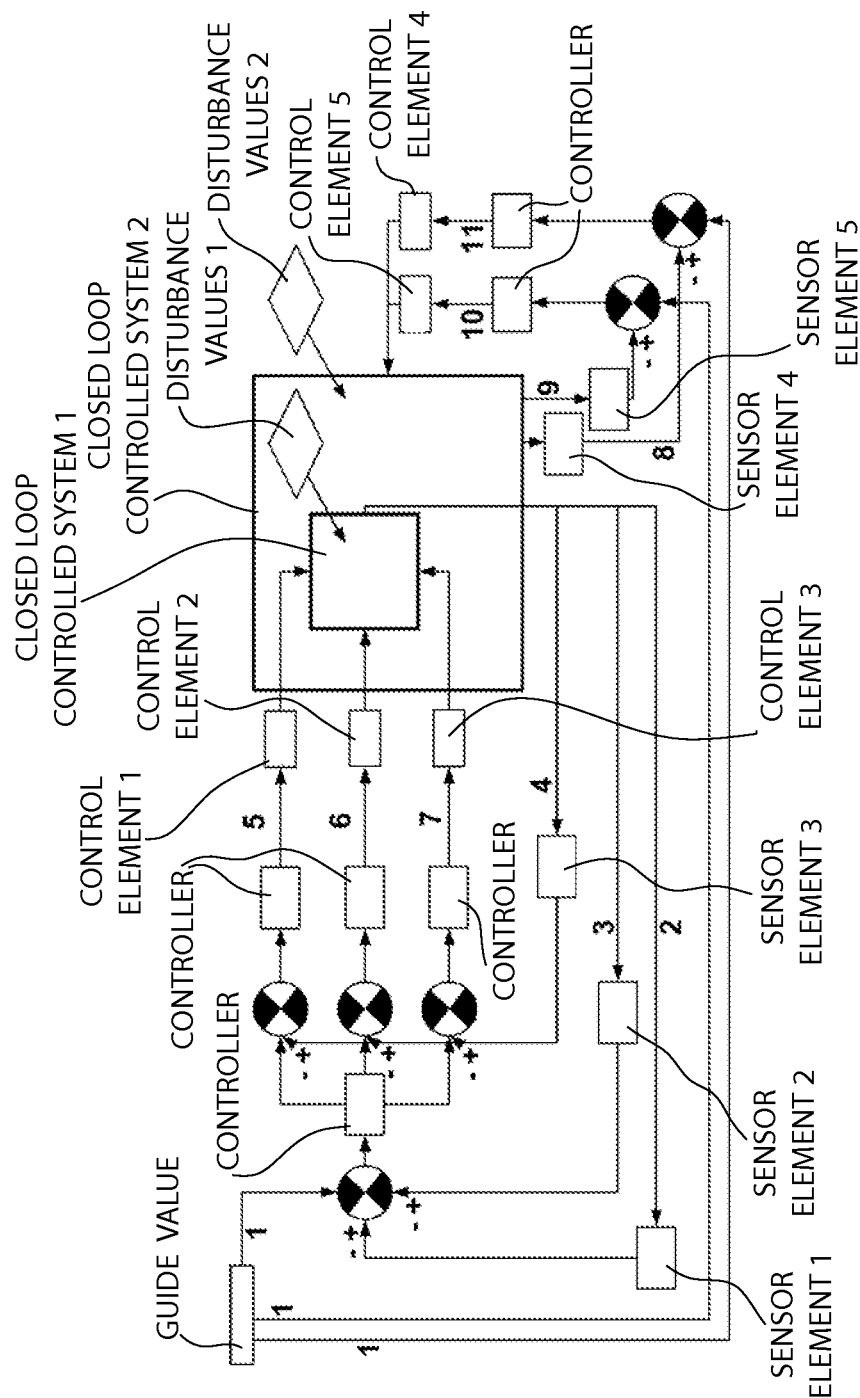
FIG. 10 is a flow chart for the novel automated crystal.

A flow chart for the novel automated crystal growth is found in FIG. 10.

In a cybernetic control loop, the inventive device (X-tal controller) can precisely regulate the molecular composition of the crystallization solution using the diagnostic sensors and micro dosing system. It is now possible for the first time to dwell at any point of the phase diagram and from there to navigate to any point. The phase diagram is therefore not passed through in only one direction, under more or less controlled speed, as is the case with the prior art methods. It is thus possible to control the crystallization and not specifically to depend on trial and error. Below the reference numerals for FIG. 10 as well as the function are explained in detail.

Guide values: are input from the outside and relate to values of changes in molarity as a function of the time or changes in radius distribution as a function of the time, for example, the intended route in the phase diagram.

Disturbance values 1 solvent evaporation, heat loss from the sample, etc.

Disturbance values 2: temperature and humidity of the environment have an influence on the interior of the process chamber and fluctuations in gas composition due to the leakage rate of the process chamber.

Sensor element 1 DLS measurement apparatus for determining the actual value of the radius distribution Sensor element 2 weight change for the determination of the actual value of the molarities Sensor element 3 thermal sensor to determine the actual value of the temperature in the sample Sensor element 4 moisture sensor for detecting the actual value of the humidity in the interior of the process chamber Sensor element 5 temperature sensor for detecting the actual value of the temperature in the reaction chamber Control element 1 microdosing system for solvent (water)

Control element 2 microdosing system for precipitant

Control element 3 microdosing system for additives

Control element 4 gas supply line to the change in the gas composition

Control element 5 device for heating and for cooling, for example Peltier element 1 desired value for the temperature in the process chamber, target value for the humidity in the process chamber, target value for the change in the setpoint for molarity versus time, target value for the change of the radii distribution in the sample depending on the time.

2 actual value for the radius distribution in the sample
3 actual value for the temperature of the sample
4 value for the mass of the sample
5 control parameter for the addition of water
6 control parameter for the addition of precipitant
7 control parameter for the addition of additives
8 actual value for the air humidity and gas composition in the process chamber
9 actual value for the temperature in the process chamber
10 control parameter for the temperature in the process chamber
11 control parameter for the humidity in the process chamber In the following an embodiment of the invention is explained in detail.

Figure 11:
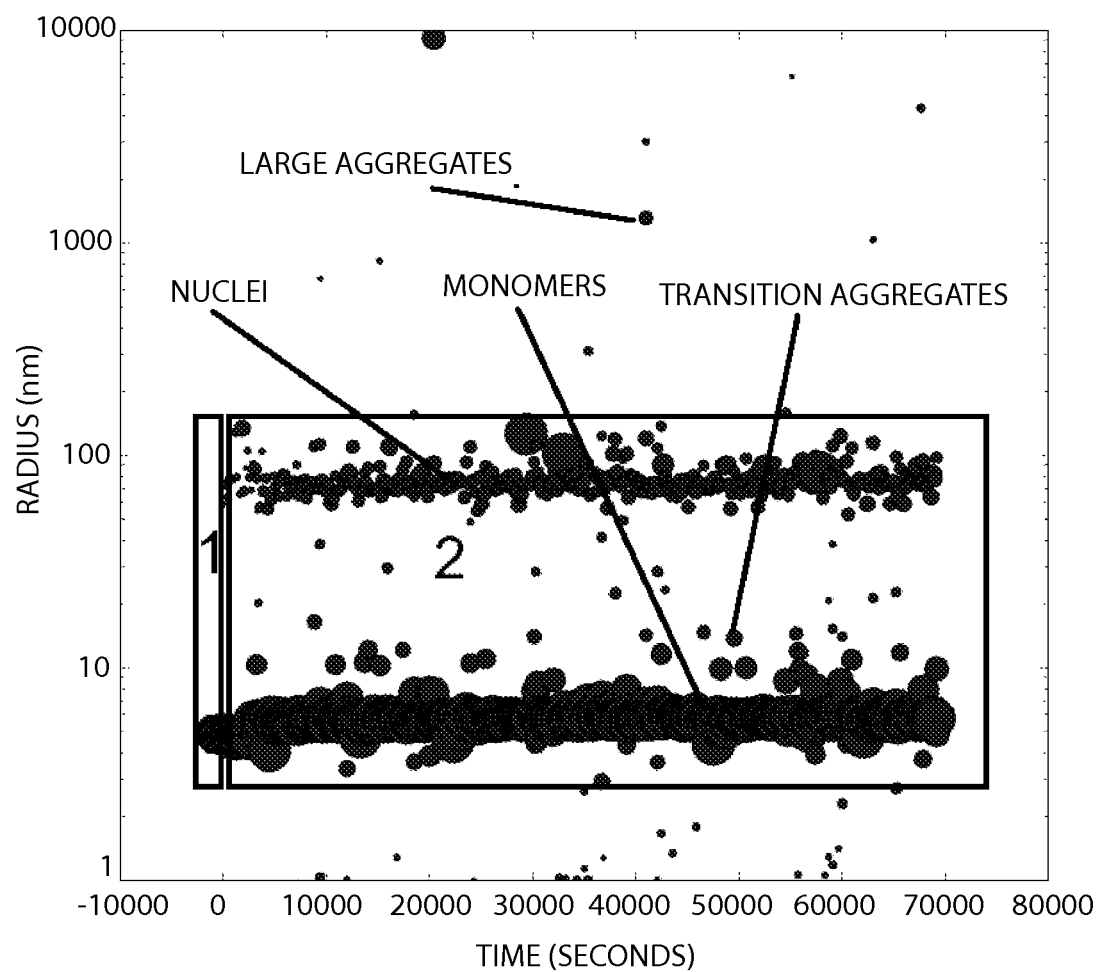
FIG. 11 shows the size distribution before addition of precipitant and the size distribution following addition of precipitant.
Figure 12:
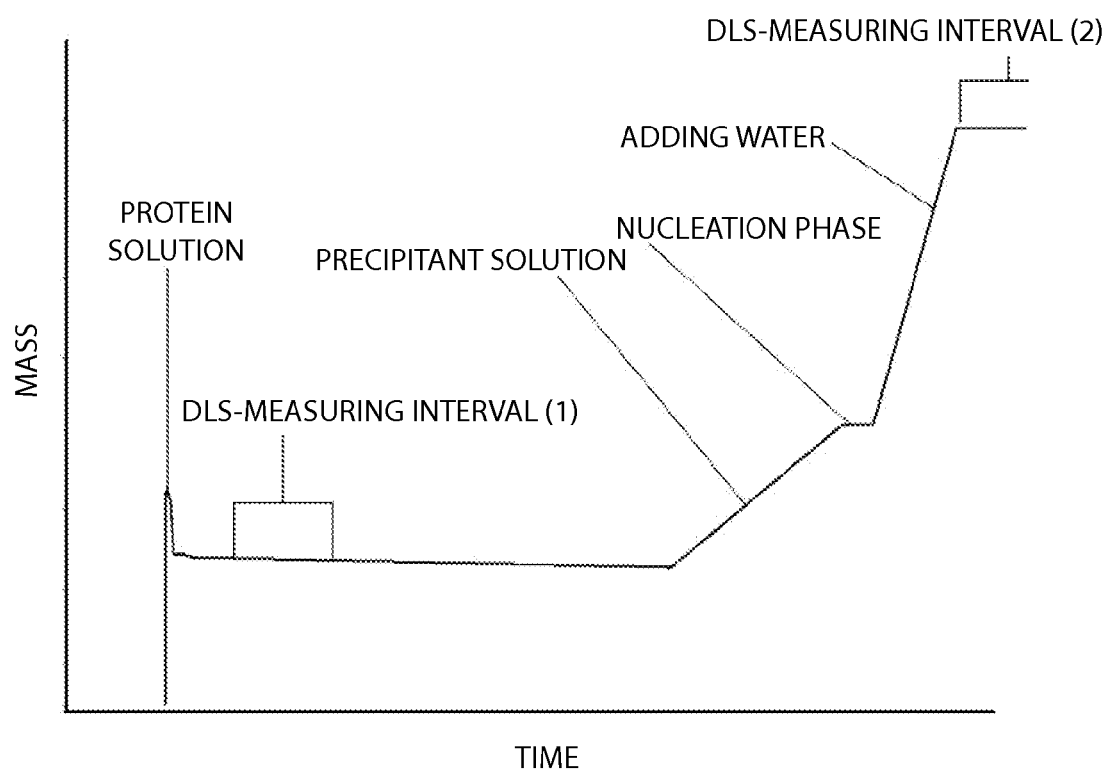
FIG. 12 shows the DLS measurement corresponding to the weight curve of FIG. 11.
Figure 13:
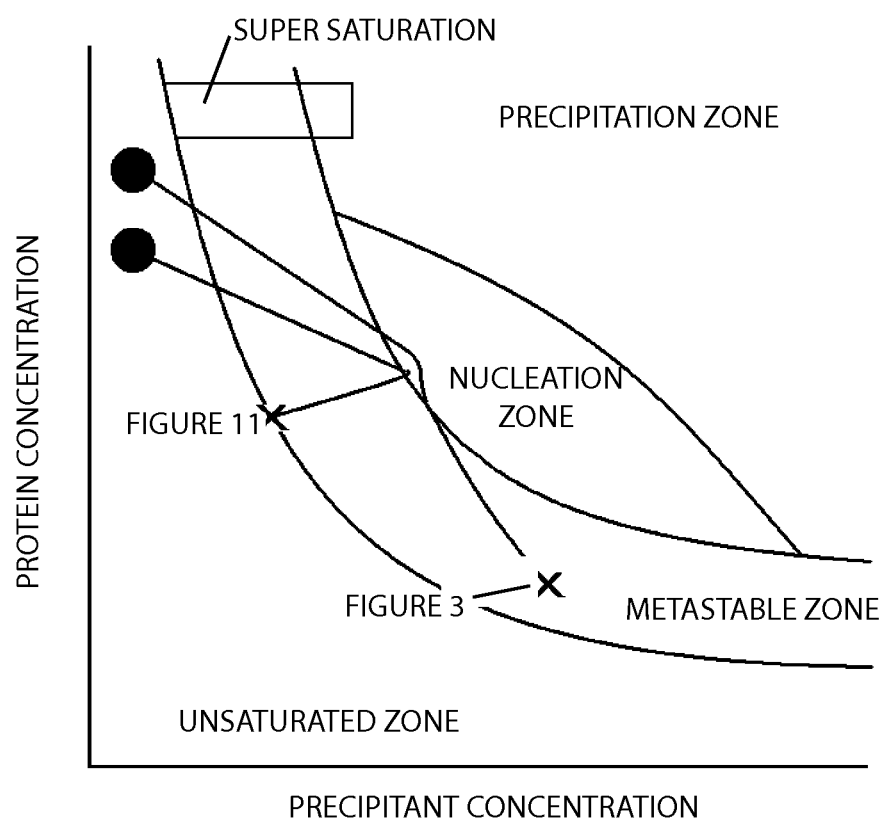
FIG. 13 shows that the transition from the metastable zone to the precipitation zone can be detected, with no increase in size of the nuclei observed.

In the X-tal controller, the transition from the metastable zone to the precipitation zone can be detected (FIGS. 3 and 11). FIG. 3 shows the increase in size of the nuclei. This is an indicator of the position in the phase diagram. At first it went into the nucleation zone, which can be recognized in the formation of larger particles and these increased both in number and in size. Using the apparatus various points in the phase diagram can be also dwell at. This can be recognized in that no increase in size of the nuclei is observed (FIGS. 11 and 13). In FIG. 11 1 shows the size distribution before addition of precipitant: There the system is in the undersaturated region of the phase diagram. 2 shows the size distribution following addition of precipitant. In FIG. 12 the DLS measurement corresponding to the weight curve of FIG. 11 is shown, 1 and 2 are the two states of solution 1 and 2 of FIG. 11. The protein and the precipitant were diluted with water. The stability of the nuclei is typical, when the system is located directly on the solubility curve (phase boundary between undersaturated solution and the metastable zone).

In FIG. 3 the phase diagram can be seen with the points of FIG. 3 and FIG. 11 specific for the inventive apparatus (X-tal controller).

LIST OF REFERENCE NUMBERS FOR FIG. 1

1 process chamber (temperature-stabilized and sealed)
2 micro-dosing unit
3 measuring device for dynamic light scattering
4 ultrasensitive scales
5 temperature control
6 humidity control
7 vibration-damped base
8 microscope lens
9 camera
10 sample
11 sample holder (in this version as cover slip)
12 displacement mechanism for thermal sensor and lighting
13 lighting with diffuser (in this case a white light LED)
14 thermosensor
15 window
16 control for the gas composition
17 database
18 PC for operation and connection to the internet and the apparatus
19 data link

The invention claimed is:
1. A method for crystallization of a substance dissolved in a solvent, comprising the steps:
introducing a substance-containing solvent volume into a chamber with a constant temperature, humidity and gas composition,
adding a predetermined volume of a precipitant to the substance-containing solvent volume,
allowing the solvent to evaporate and at the same time observing structural changes in the substance- and precipitant-containing solvent volume by means of dynamic light scattering using an optical device with sub-microscopic resolution to determine the molecular size distribution of the substance being crystallized,
detecting changes in weight and determining the molarities,
mapping to the location in a phase diagram on the basis of the dynamic light scattering measurements and the results of determination of molarities,
forming a number of crystallization nuclei by adding solvent or by adding precipitant,
transitioning of substance- and precipitant-containing solvent volume to a metastable condition by addition of solvent and/or protein solution or by allowing reduction of concentration of the dissolved substance by formation of nucleation seeds, and
maintaining the metastable condition by addition of an amount of the substance to the substance- and precipitant-containing solvent volume or allowing evaporation of the solvent until at least one crystal of a predetermined size is formed.

2. The method according to claim 1, further comprising the step of:
allowing evaporation of solvent while simultaneously adding an anti-freeze solution at a solvent-loss-compensating rate.

3. The method according to claim 1, wherein the substance-containing solvent volume is kept constant by adding solvent prior to the addition of the precipitant.

4. A device for carrying out the method according to claim 1, comprising
a chamber with means for maintaining a temperature, humidity and gas composition in the chamber
a pipetting device for the introduction of a solvent volume containing a substance to be crystallized in the chamber;
a specimen holder for receiving the solvent volume containing the substance to be crystallized,
an optical device with microscopic resolution for observation of the substance to be crystallized,
a means for dynamic light scattering to determine the molecular size distribution,
a device for static light scattering for measuring the absolute scattered light intensity,
a heat radiation sensor for the determination of reaction enthalpies,
a microbalance for the precise determination of the molar concentrations of the substance and/or the precipitant and their changes,
a micro-dosing device for the adding of solutions and materials into the volume of solvent containing the substance to be crystallized, and
means for the introduction of seed crystals.

5. A device according to claim 4, wherein the sample holder is a sample changer.

6. A device according to claim 4, wherein the one optical device is a microscope provided with a camera.

7. A device according to claim 4, wherein the micro-dosing device is adapted for dosing at least one of water, precipitant, buffer solution, protein solution, additives, antifreeze solution, cross-linkers, ligands and detergents.

* * * * *